United States Patent [19]

Sahota

[11] Patent Number: 5,665,201
[45] Date of Patent: Sep. 9, 1997

[54] HIGH REMOVAL RATE CHEMICAL-MECHANICAL POLISHING

[75] Inventor: Kashmir S. Sahota, Fremont, Calif.

[73] Assignee: Advanced Micro Devices, Inc., Sunnyvale, Calif.

[21] Appl. No.: 469,264

[22] Filed: Jun. 6, 1995

[51] Int. Cl.$^6$ .............................. H01L 21/304
[52] U.S. Cl. ............... 438/693; 216/38; 216/39; 451/36; 451/56
[58] Field of Search ............... 156/636.1, 637.1, 156/645.1, 657.1; 216/38, 52, 88, 89, 91; 451/36, 41, 56; 437/195, 203, 228, 228 POL, 228 PL, 238, 240

[56] References Cited

U.S. PATENT DOCUMENTS

| | | | |
|---|---|---|---|
| 3,841,031 | 10/1974 | Walsh | 451/41 |
| 3,911,562 | 10/1975 | Youmans | 437/79 |
| 4,193,266 | 3/1980 | Gill, Jr. et al. | 451/276 |
| 4,811,822 | 3/1989 | Gill, Jr. | 451/285 |
| 4,910,155 | 3/1990 | Cote et al. | 437/8 |
| 4,944,836 | 7/1990 | Beyer et al. | 156/645.1 |
| 5,093,279 | 3/1992 | Andreshak et al. | 437/173 |
| 5,245,794 | 9/1993 | Salugsugan | 451/10 |
| 5,246,884 | 9/1993 | Jaso et al. | 437/225 |
| 5,262,354 | 11/1993 | Cote et al. | 437/195 |
| 5,457,070 | 10/1995 | Hirade | 437/195 |
| 5,486,265 | 1/1996 | Salugsugan | 156/636.1 |
| 5,527,424 | 6/1996 | Mullins | 156/636.1 |
| 5,536,202 | 7/1996 | Appel et al. | 451/285 |

OTHER PUBLICATIONS

Ali et al., "Chemical–mechanical polishing of interlayer dielectric: A review," Solid State Technology, Oct. 1994, pp. 63–68.

Kaufman et al., "Chemical–Mechanical Polishing for Fabricating Patterned W Metal Features as Chip Interconnects," J. Electrochem. Soc., vol. 138, No. 11, Nov. 1991, pp. 3460–3464.

Joshi "A New Damascene Structure for Submicrometer Interconnect Wiring," IEEE Electron Letters, vol. 14, No. 3, Mar. 1993, pp. 129–132.

Kaanta et al., "Dual Damascene: A ULSI Wiring Techology," Jun. 11–12, 1991, VMIC Conference, IEEE, pp. 144–152.

Kenney et al., "A Buried–Plate Trench Cell for a 64–Mb DRAM," 1992 Symposium on VLSI Technology Digest of Technical Papers, IEEE, pp. 14–15 no month available.

*Primary Examiner*—Kathryn L. Gorgos
*Assistant Examiner*—William T. Leader

[57] ABSTRACT

Chemical-mechanical polishing is conducted under aggressive conditions, preferably with aggressive conditioning of the polishing pad, to effect uniform planarization at high removal rates. It is preferred to condition the polishing pad with an abrasive diamond grit wheel and to vary the residence time of the diamond grit for different sections of the polishing pad.

33 Claims, 4 Drawing Sheets

HIGH REMOVAL RATE CHEMICAL-MECHANICAL POLISHING

TECHNICAL FIELD

The present invention relates to a method and apparatus for chemical-mechanical polishing (CMP), particularly for planarizing an insulating layer.

BACKGROUND OF THE INVENTION

Semiconductor integrated circuits are typically manufactured by forming an array of separate dies on a common semiconductor wafer. During processing, the semiconductor wafer is treated to form specified regions of insulating, conductive and semiconductor type materials. The ever increasing requirements for high density devices comprising conductive wiring patterns with increasingly smaller distances between conductive lines and small diameter vias in dielectric layers, particularly at high rates of production, pose a significant technological challenge. Conventionally, a conductive wiring pattern comprising a dense array of conductive lines is formed by depositing a metal layer, etching to form a conductive pattern and applying a dielectric material. Single and dual damascene techniques have also been employed to form openings in a dielectric layer which are subsequently filled with metal. The application of damascene techniques to the manufacture of semiconductor devices is disclosed in Joshi, "A New Damascene Structure for Submicrometer Interconnect Wiring," IEEE Electron Letters, Vol. 14, No. 3, Mar. 1993, pp. 129–132; Kaanta et al., "Dual Damascene: A ULSI Wiring Technology," Jun. 11–12, 1991, VMIC Conference, IEEE, pp. 144–152; Kenney et al., "A Buried-Plate Trench Cell for a 64-Mb DRAM," 1992 Symposium on VLSI Technology Digest of Technical Papers, IEEE, pp. 14–15; U.S. Pat. Nos. 5,262,354; and 5,093,279. After formation of the wiring pattern, planarization is effected as by chemical-mechanical polishing.

As shown in FIG. 1A, during an initial processing stage for forming an integrated circuit, a dielectric film 10 is deposited over a patterned conductive layer such as a metal 11. The object is to planarize steps 12 in dielectric layer 10 as shown in FIG. 1B. After deposition of layer 10, the portion thereof outside the trench must be removed. Such removal can be effected by plasma etching, or by a simplified faster and relatively inexpensive method known as chemical-mechanical planarization or polishing (CMP).

CMP is a conventional technique as disclosed in, for example, Salugsugan, U.S. Pat. No. 5,245,794; Beyer et al., U.S. Pat. No. 4,944,836; Youmans, U.S. Pat. No. 3,911,562. CMP is discussed in relation to earlier methods of fabricating metal interconnect structures by Kaufman et al., "Chemical-Mechanical Polishing for Fabricating Patterned W Metal Features as Chip Interconnects," J. Electrochem. Soc., Vol. 138, No. 11, Nov. 1991, pp. 3460–3464. U.S. Pat. Nos. 4,193,226 and 4,811,522 to Gill, Jr. and U.S. Pat. No. 3,841,031 to Walsh relate to CMP apparatus. Various problems associated with CMP are discussed by Ali et al., "Chemical-mechanical polishing of interlayer dielectric: A review," Solid State Technology, October 1994, pp. 63–68.

Basically, in employing a conventional CMP apparatus, semiconductor wafers having a dielectric layer applied thereon to be polished are mounted on a carrier assembly and placed on the CMP apparatus. A rotatable polishing pad is adapted to engage the semiconductor wafers carried by the carrier assembly. A chemical agent containing an abrasive, typically a slurry, is dripped onto the rotating polishing pad continuously during the CMP operation at a rate of about 50 to about 500 ml/min. while pressure is applied to the semiconductor wafers via the carrier assembly.

A typical CMP apparatus 100 is shown in FIG. 2 and comprises a rotatable polishing platen 102, polishing pad 104 mounted on platen 102, driven by microprocessor control motor (not shown) to spin at about 10 to about 100 RPM. Wafer 106 is mounted on the bottom of a rotatable carrier assembly 108 so that a major surface of wafer 106 to be polished is positionable to contact the underlying polishing pad 104. Wafer 106 and carrier assembly 108 are attached to a vertical spindle 110 which is rotatably mounted in a lateral robotic arm 112 which rotates the carrier assembly 108 at about 10 to about 75 RPM, preferably in excess of 20 RPM in the same direction as platen 102 and radially positions the carrier assembly on the platen. Robotic arm 112 also vertically positions carrier assembly 108 to bring wafer 106 into contact with polishing pad 104 and maintain an appropriate polishing contact pressure. Carrier assemblies are available which accommodate a plurality of wafers. A tube 114 opposite carrier assembly 108 above polishing pad 104 dispenses and evenly saturates the pad with an appropriate cleaning agent 116, typically a slurry.

As shown in FIG. 3, polishing pad 31 rotates in the direction of arrow 35, while carrier assembly 32 rotates in the direction of arrow 34, similar to the direction of arrow 35, but at a different speed than the polishing pad, while a downward force is applied to the carrier assembly 32 at 33 in a direction perpendicular to carrier assembly 32.

A polishing pad typically employed in a conventional CMP apparatus comprises a fibrous polymeric material, such as polyurethane and/or a polyester. One such type of fibrous polymeric polishing pad is IC 1000, commercially available in a pad set marketed as IC 1000/SUBA4 by Rodel of Newark, Del. It is difficult to uniformly planarize dielectric layers, doped and undoped, particularly dielectric layers having small diameter vias, e.g., less than about 0.5 microns, and dielectric layers comprising dense conductive patterns having interwiring spacings less than about 0.5 microns. It is also difficult to uniformly planarize a plurality of semiconductor wafers sequentially with a substantial degree of consistent uniformity. These problems stem from the difficulty in planarizing a dielectric layer on a semiconductor wafer to achieve a uniform removal rate across the dielectric surface, particularly at a high rate of removal.

The difficulty in achieving uniform planarization is a problem which is recognized in the semiconductor industry. Previous attempts to solve this problem focus upon improvements in consumable materials employed during CMP, such as the polishing pad and cleaning agent, or improvements in the hardware itself, such as the CMP apparatus. The difficulty in achieving a uniform removal rate across the surface of a semiconductor wafer, particularly at a high removal rate, is also recognized in the art. See, for example, Cote et al., U.S. Pat. No. 4,910,155, wherein a CMP technique is disclosed employing a pool of slurry at a temperature of 85° F. to 95° F. to economically improve uniformity by increasing polishing pad lifetime without introducing areas of locally incomplete polishing, e.g., bumps. The disclosed technique is said to require a break-in procedure which is less vigorous than conventional conditioning techniques and, thereby, extend the lifetime of the polishing pad. The slurry pool is obtained by providing a retaining wall or damn to increase the amount of slurry provided to the polishing pad. The amount of slurry sufficient to completely cover the polishing pad even when it is spinning during the CMP process, e.g., approximately ¼" deep. In the method disclosed by Cote et al., when employing a pool of slurry, the polishing pad and wafer carrier or quill are reduced from 120 rpm to 15 to 30 rpm.

Notwithstanding the CMP technique disclosed by Cote et al., it is recognized in column 4, lines 44 et sec., that uniform removal rates were only achieved at about 500 Å to 1,500 Å/min. Cote et al. report that uniform planarization of a dielectric layer on a semiconductor wafer, i.e., blanket planarization, could not be achieved at a removal rate above about 2,000 Å/min., with the adverse occurrence of nonuniformities, such as bumps. It was recognized that when planarizing an isolated portion of the surface of a semiconductor wafer, such as a passivation layer overlying a steep topographical feature, a localized removal rate of up to 6,000 Å/min. can be achieved without the formation of bumps. However, this is recognized as quite a different matter from planarizing the surface of a semiconductor wafer, i.e., blanket planarization vis-à-vis planarization of a localized topographical feature.

There exists in the semiconductor industry a need for a CMP technique for uniformly planarizing a dielectric layer on a semiconductor wafer at a high removal rate, e.g., in excess of about 2,500 Å/min., particularly for CMP a plurality of semiconductor devices sequentially with substantially consistent uniformity.

DISCLOSURE OF THE INVENTION

An object of the present invention is a CMP method for uniformly planarizing a dielectric layer on a semiconductor wafer at a high removal rate.

Another object of the present invention is a CMP method for uniformly planarizing a dielectric layer on a plurality of semiconductor wafers at a high removal rate with substantially consistent uniformity among the semiconductor wafers.

Additional objects, advantages and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

According to the present invention, the foregoing and other objects are achieved in part by a method of uniformly planarizing a dielectric layer on a semiconductor wafer, which method comprises: CMP the dielectric layer on a polishing pad while dispensing a slurry on the polishing pad; rotating the polishing pad at a rate of about 10 to about 100 rpm; and applying a pressure of about 6 to about 15 psi to the semiconductor wafer, whereby the dielectric layer is removed at a rate of about 3,000 Å/min. to about 12,000 Å/min.

Another aspect of the present invention is a method of uniformly planarizing a dielectric layer on a plurality of semiconductor wafers sequentially, which method comprises: chemical-mechanical polishing the dielectric layer on a polishing pad while dispensing a slurry on the polishing pad; rotating the polishing pad at a rate of about 10 to about 100 rpm; applying a pressure of about 6 to about 15 psi. to the semiconductor wafers, whereby the dielectric layer is removed at a rate and 3,000 Å/min. to about of about 12,000 Å/min.; conditioning the polishing pad utilizing an abrasive diamond grit wheel prior to chemical-mechanical polishing each semiconductor wafer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1A:
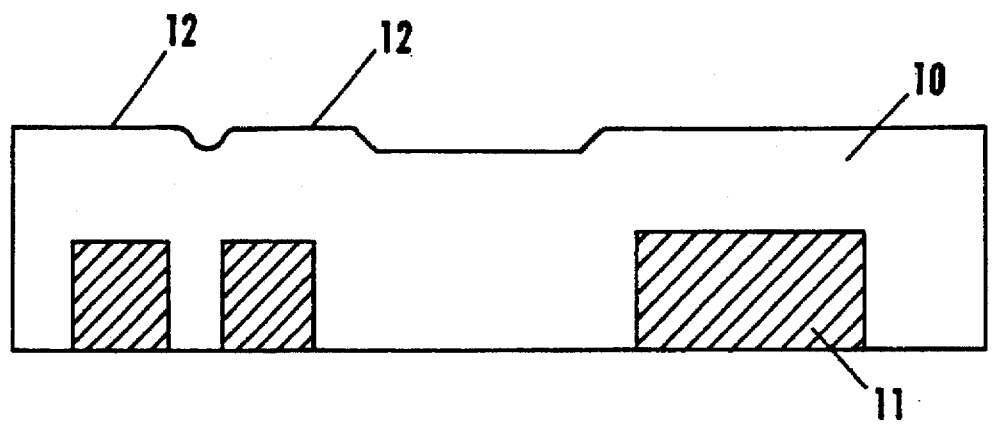
FIG. 1A schematically illustrates a covered pattern prior to planarization.
Figure 1B:
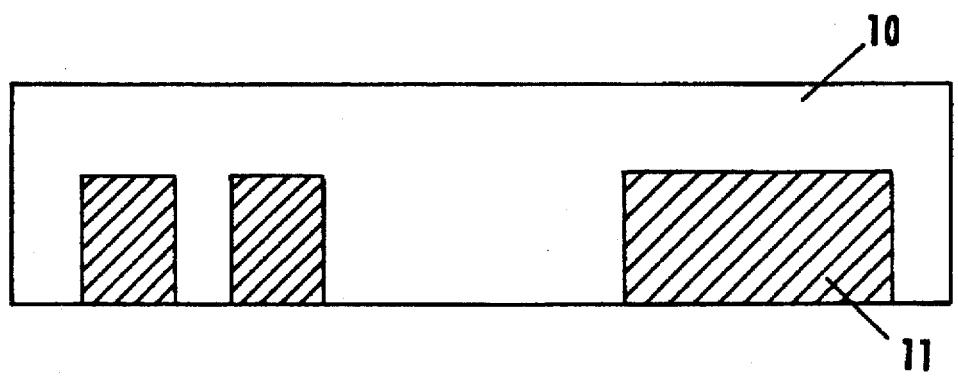
FIG. 1B schematically illustrates a planarized pattern.
Figure 2:
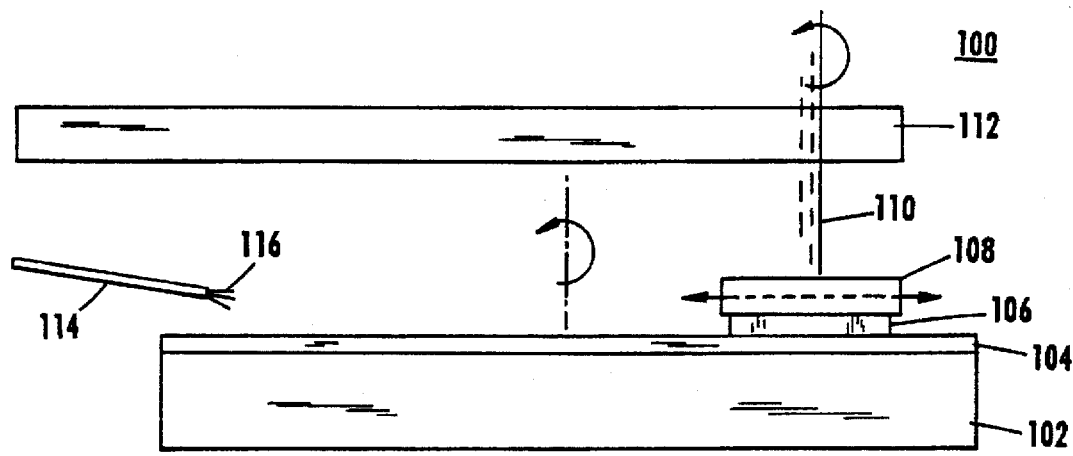
FIG. 2 schematically illustrates a typical CMP apparatus.
Figure 3:
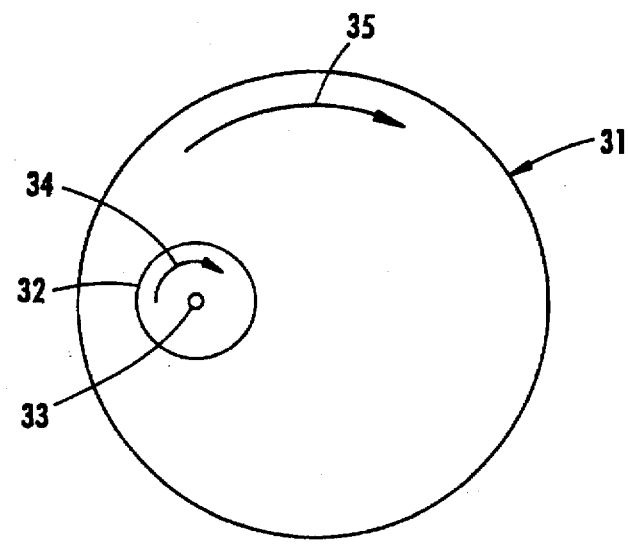
FIG. 3 schematically illustrates a typical CMP arrangement.

The present invention addresses the recognized problem in the semiconductor industry of uniformly planarizing a dielectric layer on a semiconductor wafer by CMP at a high removal rate. A solution to this problem has, to date, eluded those skilled in the art. As used throughout this disclosure, including the specification and claims, the expression "planarization," when referring to a semiconductor wafer or dielectric layer thereon, denotes planarization of substantially the entire surface, i.e., blanket planarization, as that expression would have been understood by one having ordinary skill in the art vis-à-vis planarization of a local topographical feature on the surface of a semiconductor wafer. See, for example, Cote et al. The expression "planarization," in the context of the present invention, does not refer to or include planarizing a local topographical feature on the surface of a semiconductor wafer. The expression "uniform" or "uniformly" is used in the context of the present invention understood by one having ordinary skill in the art to achieve a satisfactory uniform surface for use in semiconductor devices.

In accordance with the present invention, a dielectric layer on a semiconductor device is uniformly planarized at a high removal rate, i.e., above about 2,500 Å/min. In addition, in accordance with the present invention, a plurality of semiconductor devices having a dielectric layer thereon are uniformly planarized sequentially at a removal rate greater than about 2,500 Å/min. with substantial consistency, i.e., the degree of uniformity of the planarized layer of each semiconductor wafer is substantially the same. The present invention also encompasses CMP a group of semiconductor wafers simultaneously and a plurality of groups of semiconductor wafers sequentially.

In accordance with the present invention, uniform planarization of a dielectric layer is achieved at a removal rate in excess of about 2,500 Å/min. by a strategic and aggressive selection of process parameters. In accordance with the conventional practices, it was not considered feasible to achieve uniform planarization at a high removal rate by employing relatively high pressures and high rotation speeds for the polishing pad. However, after extensive experimentation investigation, it was found that a uniformly planarized dielectric layer can be obtained at a high rate of removal, i.e., in excess of 2,500 Å/min., including rates of removal up to 12,000 Å/min., by proceeding against conventional wisdom by strategically selecting aggressive process parameters. On further experimentation and investigation, it was found that the degree of uniformity and rate of removal is enhanced by aggressively conditioning the polishing pad. It was also found that by employing an aggressive conditioning technique, preferably a controlled aggressive conditioning technique wherein different portions of the polishing pad are conditioned for different periods of time, uniform planarization of a plurality of semiconductor, wafers is achieved, sequentially, at a high removal rate with a substantially consistent degree of uniformity from semiconductor wafer to semiconductor wafer.

In accordance with the present invention, a dielectric layer on a semiconductor wafer is uniformly planarized by CMP at a high rate of removal by rotating the polishing pad at a rate of about 10 to about 100 rpm, preferably in excess of 30 rpm, most preferably between 50 and 80 rpm. In a preferred embodiment of the present invention, the polishing pad is rotated at a rate of about 65 rpm. In addition, uniform planarization of a dielectric layer at a high removal rate is achieved by applying a high pressure to the semiconductor wafer during CMP of about 6 to about 15 psi, preferably about 8 to about 12 psi. In a preferred embodiment, a pressure of about 10 psi is applied to the semiconductor wafer during CMP.

As a result of extensive investigation and experimentation, it was found that the 2,000 Å/min. removal rate barrier of conventional practices can be unexpectedly surpassed by applying a rather aggressive CMP technique under severe conditions. In fact, by the strategic application of severe conditions, uniform planarization of a dielectric layer can be performed at rates of removal in excess of 2,500 Å/min. up to, for example, 12,000 Å/min.

In a preferred embodiment of the present invention, the polishing pad is subjected to aggressive conditioning, preferably prior to each CMP operation on a semiconductor wafer. Quite surprisingly, it was found that the uniformity of the planarized surface is improved and the rate of removal of dielectric material increased by aggressively conditioning the polishing pad prior to its initial use in CMP, i.e., aggressively conditioning a new polishing pad which had not been previously used in CMP. A preferred aggressive conditioning technique comprises conditioning a new polishing pad, and conditioning the polishing pad between each CMP operation on a plurality of semiconductor wafers, sequentially, with, an abrasive diamond grit wheel under pressure while dispensing a polishing slurry on the polishing pad.

As pointed out by Cote et al., it is known to condition a polishing pad by scraping with a blade. However, this technique is not looked favorably upon by Cote et al., in that it adversely affects the life of the polishing pad. It was found, however, that from an economic standpoint, whatever negative impact aggressive conditioning may have on the life of a polishing pad is more than outweighed by the unexpected improved uniformity and increased removal rate, thereby increasing production of high quality semiconductor devices with a reduced rejection rate.

During CMP, the roughness of a polishing pad is decreased, thereby reducing the desired abrasiveness of the surface of the polishing pad and, consequently, the amount of slurry capable of being transported from the polishing pad to a semiconductor wafer during CMP. Accordingly, it is known to condition a polishing pad periodically between CMP operations in an attempt to restore the initial degree of surface roughness. Quite surprisingly, after extensive experimentation, it was found that the application of an aggressive conditioning treatment to a new, unused polishing pad enhances the uniformity of the planarized layer and increases the rate of removal of dielectric material. Accordingly, in another aspect of the present invention, a new, unused, polishing pad is subjected to aggressive conditioning with a greater number of sweeps than between subsequent successive CMP operations.

In accordance with the present invention, the polishing pad is conditioned prior to each CMP operation, including the initial use of a new polishing pad, with an abrasive diamond grit wheel under aggressive conditions. For example, it has been found advantageous to apply a force on the diamond wheel of about 6 to 8 lbs. while rotating the polishing pad at a rate of 15 to 50 rpm, and rotating the abrasive diamond grit wheel at a rate of 20 to 40 rpm. It has also been found advantageous to traverse the surface of a new polishing pad about 10 to about 30 sweeps, for about 4 to about 10 minutes, a sweep denoting movement of the abrasive diamond grit wheel from the center portion to the peripheral portion or from the peripheral portion to the center portion of the polishing pad. The initial conditioning of a new polishing pad preferably comprises traversing the surface of the polishing pad about 15 to about 25 sweeps for about 5 to about 9 minutes, most preferably about 20 sweeps for about 7 to about 8 minutes. After a polishing pad has been used for CMP, it has been found advantageous to aggressively condition the polishing pad, before each subsequent CMP operation, for about 3 to about 7 sweeps.

In a preferred aspect of the present invention, aggressive conditioning is controlled with respect to different portions of the surface of the polishing pad undergoing to achieve a high uniform removal rate across the surface of a semiconductor wafer. Thus, after further extensive experimentation and investigation, it was found advantageous to aggressively condition the surface of a polishing pad, as with an abrasive diamond grit wheel, by employing a longer residence time at the center portion of the polishing pad than at the peripheral portion thereof. In a preferred controlled aggressive conditioning technique, the residence time at an intermediate portion of the surface of the polishing pad between the center portion and the peripheral portion thereof is less than at the center portion and at the peripheral portion thereof. It was found that such a conditioning recipe improves the uniformity of the removal rate across the surface of the semiconductor wafer, thereby, improving the degree of uniformity of the CMP planarized layer, increasing the removal rate and improving the degree of consistency of uniformity from wafer to wafer.

Set forth below in Table I is a typical and preferred controlled aggressive conditioning schedule for different sections of a polishing pad wafer. The sections are defined, in a conventional manner, with 0-1 indicating the center portion and 9-10 representing the peripheral portion thereof. Sections 1-2 to 8-9 represent portions extending sequentially from the center portion to the peripheral portion of the surface of the polishing pad.

TABLE I

| SEGMENT | RESIDENCE TIME (SEC) |
|---|---|
| 0–1 | 2–5; pfd. 3.6 |
| 1–2 | 0.5–4; pfd. 2.7 |
| 2–3 | 0.5–3; pfd. 1.8 |
| 3–4 | 0.5–2.5; pfd. 1.5 |
| 4–5 | 0.5–2.5; pfd. 1.5 |
| 5–6 | 0.5–2.5; pfd. 1.5 |
| 6–7 | 0.5–2.5; pfd. 1.5 |
| 7–8 | 0.5–2.5; pfd. 1.5 |
| 8–9 | 0.5–3.7; pfd. 2.1 |
| 9–10 | 0.5–4; pfd. 2.4 |

Thus, in accordance with the present invention, the dielectric layer on a semiconductor wafer is uniformly planarized at a high removal rate in excess of 2,500 Å/min. by employing aggressive CMP condition, i.e., a high pressure and high speed rotation of the polishing pad, in addition to an aggressive conditioning technique. It was surprisingly found that a pre-CPM polishing conditioning technique, on a new, unused polishing pad, effectively enhances the uniformity of planarization, rate of removal of dielectric material, and consistency of results from semiconductor wafer to semiconductor wafer.

Figure 4A:
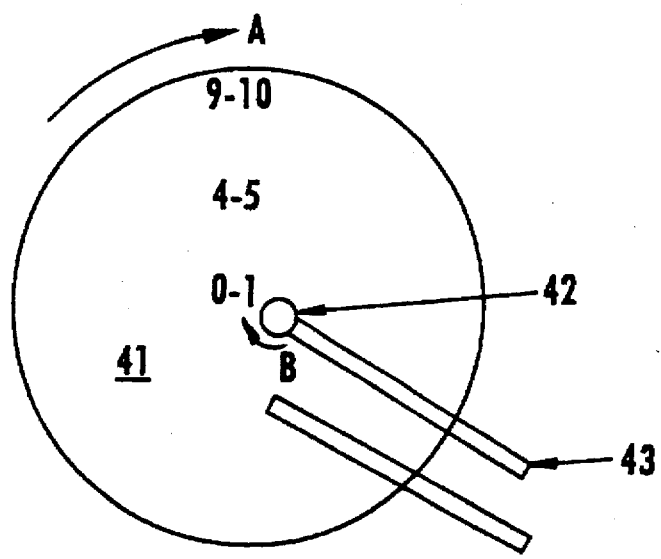
FIG. 4A illustrates a conditioning embodiment of the present invention.
Figure 4B:
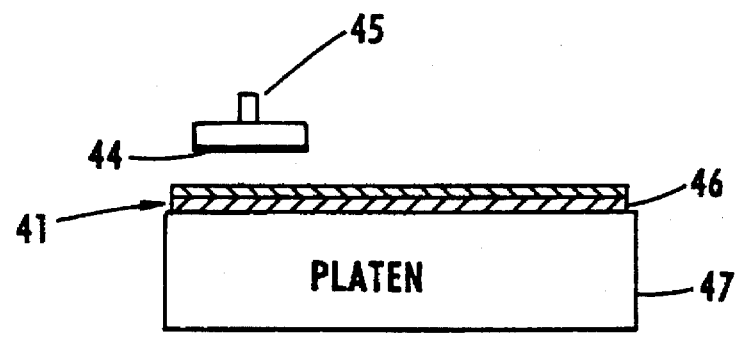
FIG. 4B illustrates a CMP embodiment of the present invention.

The practice of the present invention is illustrated in FIGS. 4A and 4B, wherein polishing pad 41 rotating in the direction of arrow A is conditioned with an abrasive diamond grit wheel 42 rotating in the direction of arrow B, in the same direction as the polishing pad. A slurry is dispensed on polishing pad 41 by drip tube 43 during conditioning. Consistent with conventional nomenclature, the center portion of the polishing pad is designated section 0-1, the peripheral portion designated section 9-10, with an intermediate portion designated section 4-5. Sections 1-2 through 3-4 are situated between sections 0-1 and 4-5; while sections 5-6 through 8-9 are situated between sections 4-5 and 9-10. A sweep denotes traversal of abrasive diamond grit wheel 42 from section 0-1 to section 9-10, or traversal of abrasive diamond grit wheel 42 from section 9-10 to section 0-1.

In FIG. 4B, a CMP operation is depicted wherein wafer 44, mounted in carrier 45, is subjected to CMP on polishing pad 41 joined to supporting sub-layer 46 which is mounted on platen 47.

In practicing the present invention, any conventional polishing pad can be employed, such as a conventional fibrous polymeric polishing pad, e.g., IC 1000 previously mentioned. In a preferred embodiment of the present invention, in order to minimize wafer to wafer variation in the polishing rate and, therefore, further increase production throughput, it has been found advantageous to fabricate the polishing pad in the form of a dome with the dome at its center portion. A dome-shaped polishing pad can be formed by employing conventional manufacturing techniques, such as machining a conventional flat polishing pad. In a preferred aspect of this embodiment of the present invention, the dome-shaped polishing pad is aggressively conditioned with an abrasive diamond grit wheel employing a longer residence time at the peripheral and center portions than at the intermediate portions. This can be conveniently achieved by increasing the conditioning residence time at the beginning and end of a sweep.

Advantageously, the present invention achieves uniform CMP planarization at unexpectedly high rates of removal without the need of a slurry dam as required by Cote et al., by proceeding against conventional wisdom in the art and employing aggressive CMP and aggressive conditioning parameters. Thus, a high uniform rate of removal across the surface of a semiconductor wafer is achieved, with a substantially consistent degree of planarization from wafer to wafer.

The present invention is applicable to dielectric materials in general, such as those conventionally employed in the fabrication of semiconductor devices. It is, however, preferred to employ dielectric materials in the form of oxides, such as silicon dioxide, phosphosilicate glass (PSG) or boro-phosphosilicate glass (BPSG), preferably silicon dioxide derived from deposited tetraethyl orthosilicate (TEOS).

The dielectric layers planarized in accordance with the present invention by CMP can be either doped or undoped, and can contain conductive patterns comprising a plurality of conductive lines with interwiring spacings therein, including submicron interwiring spacings below about 0.5 microns. The present invention can be practiced employing otherwise conventional CMP techniques and apparatus. The polishing agent employed in the claimed invention can be any of those conventionally employed in CMP processing, such as conventional slurry dispensed in a drip tube.

The following examples demonstrate the effectiveness of the present invention.

EXAMPLE 1

Semiconductor wafers were provided with a dielectric layer of silicon dioxide derived from deposited TEOS in a conventional manner. Some dielectric layers were undoped and others doped with boron and phosphorous. The polishing pad employed was IC 1000 over SUBA IV marketed by Rodel Corporation, Newark, Del. Table II sets forth the CMP parameters employed.

TABLE II

|  | Undoped oxides | Doped oxides |
|---|---|---|
| Polish arm PRESSURE = | 10 psi | 10 psi |
| Wafer carrier Speed = | 10 rpm | 15 rpm |
| Polish Pad Rotation = | 65 rpm | 20–65 rpm |
| Slurry flow = | 100–200 ml/min | 100–200 ml/min |
| Slurry Conditions = | Ambient | Ambient |

In addition to the aggressive CMP conditions set forth in Table II above, the polishing pad was initially conditioned employing the preferred residence time set forth in Table I, with a downward force of about 6 to about 8 lbs., while rotating the abrasive diamond grit wheel at about 20 to about 40 rpm, and rotating the polishing pad at about 15 to about 50 rpm. The initial number of sweeps was 20 on the unused polishing pad, and 3 to 7 sweeps between semiconductor wafers sequentially planarized by CMP. After planarization, the semiconductor wafers were analyzed by a PYROMETRIX 750, available from Tencor, Inc., Santa Clara, Calif., to ascertain the dielectric film thickness and uniformity. Another conventional analytical tool is the Optiprobe 1600/2600 available from Thermawave, Inc., Fremont, Calif.

The undoped oxide was uniformly planarized at a removal rate of 4,000 Å/min. to 5,000 Å/min. The doped oxide was uniformly planarized at a removal rate of 7,500–12,000 Å/min.

EXAMPLE 2

Figure 5:
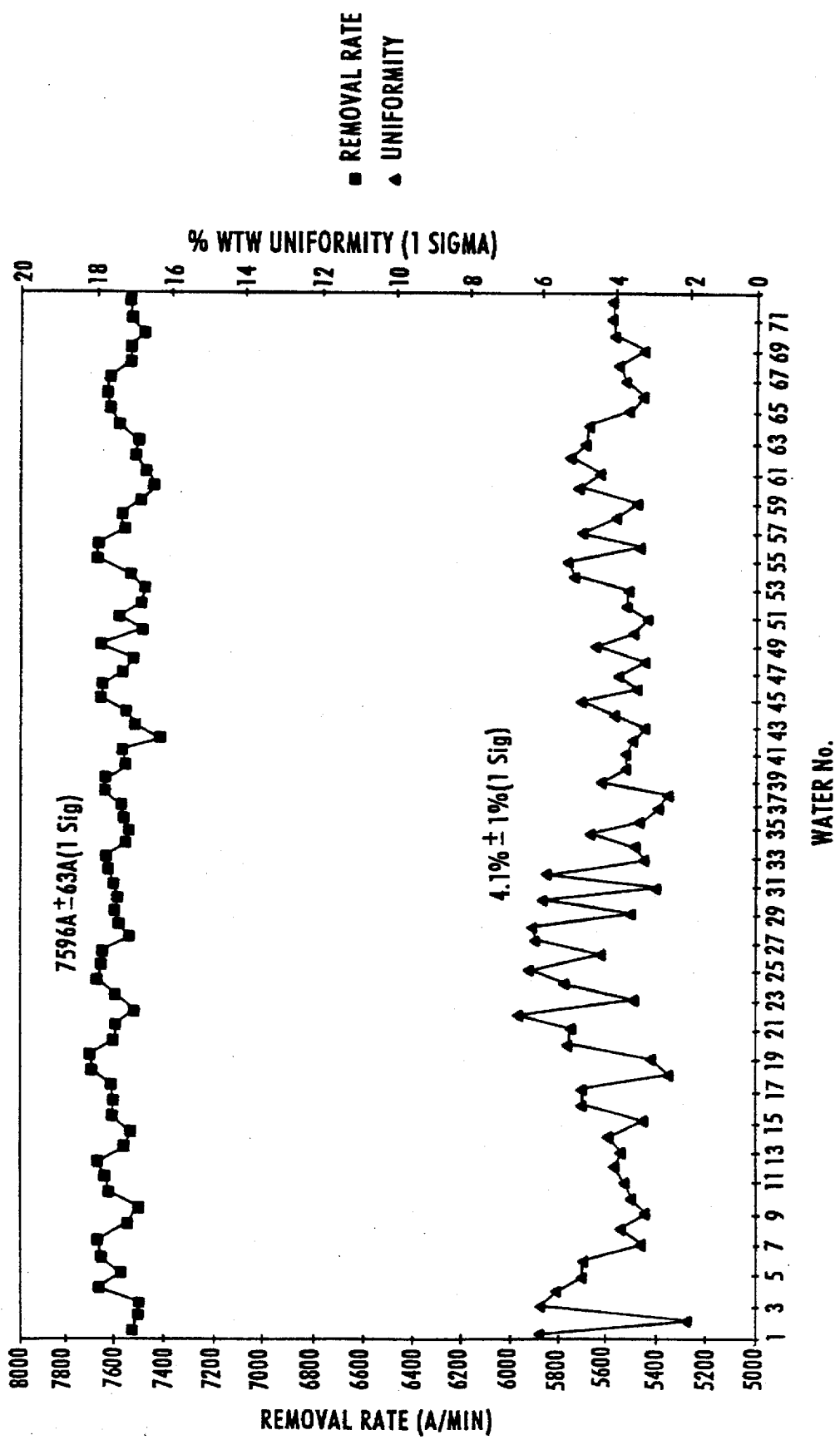
FIG. 5 is a graph showing the results of experimentation. de

In this Example, dielectric layers comprising boron and phosphorous doped silicon dioxide derived from deposited TEOS were subjected to aggressive CMP planarization in accordance with the present invention, and the removal rate and uniformity measured. The conditions are set forth below in Table III. The results, shown in FIG. 5, demonstrate consistently uniform planarization at high removal rates.

TABLE III

| Run No. | PRESSURE psi | PLATEN ROTATION RPM | CARRIER ROTATION RPM | REMOVAL RATE A/MIN | WIW UNIFORMITY % |
|---|---|---|---|---|---|
| 1 | 6.0 | 10 | 10 | 2874 | 6.2 |
| 2 | 10.0 | 45 | 10 | 12172 | 5.2 |
| 3 | 10.0 | 10 | 45 | 4871 | 6.8 |
| 4 | 6.0 | 45 | 45 | 7810 | 7.8 |
| 5 | 10.0 | 10 | 10 | 4452 | 3.9 |
| 6 | 6.0 | 10 | 45 | 3401 | 15.4 |
| 7 | 6.0 | 45 | 10 | 7633 | 7.2 |
| 8 | 8.0 | 10 | 10 | 3684 | 6.5 |
| 9 | 6.0 | 28 | 10 | 6083 | 5.7 |

The present invention has, therefore, been demonstrated to achieve unexpectedly uniformly planarized dielectric layers on a semiconductor wafer at a high rate of removal in excess of 2,500 Å/min., with consistent wafer to wafer uniformity, by employing aggressive CMP conditions and aggressive conditioning on a new, unused polishing pad and between subsequent sequential CMP operations. The present invention is applicable to all phases of manufacturing semiconductor devices wherein a dielectric layer is planarized, including doped and undoped dielectric layers, and including dielectric layers having conductive patterns and/or vias therein, including conductive patterns and/or vias with minimal spacings in the submicron range, e.g., below 0.5 microns.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

I claim:

1. A method of uniformly planarizing a dielectric layer on a semiconductor wafer, which method comprises;

conditioning the polishing pad with an abrasive diamond grit wheel, including varying the residence time of the abrasive diamond grit for different sections of the polishing pad;

after conditioning the polishing pad chemical-mechanical polishing the dielectric layer on the polishing pad while dispensing a slurry on the polishing pad;

rotating the polishing pad at a rate of about 10 to about 100 rpm; and applying a pressure of about 6 to about 15 psi to the semiconductor wafer, whereby the dielectric layer is removed at a rate of about 3,000 Å/min. to about 12,000 Å/min.

2. The method according to claim 1, wherein the dielectric layer comprises an oxide.

3. The method according to claim 2, wherein the dielectric layer comprises silicon dioxide, phosphosilicate glass or boro-phosphosilicate glass.

4. The method according to claim 2, wherein the dielectric layer comprises an undoped oxide and the removal rate is about 4,000 Å/min. to about 5,000 Å/min.

5. The method according to claim 2, wherein the dielectric layer is a doped oxide and the removal rate is about 7,500 Å/min. to about 12,000 Å/min.

6. The method according to claim 5, wherein the dielectric layer comprises silicon dioxide derived from tetraethyl orthosilicate doped with boron and phosphorous.

7. The method according to claim 2, wherein the oxide is silicon dioxide derived from tetraethyl orthosilicate doped with boron and phosphorous.

8. The method according to claim 1, comprising planarizing a dielectric layer on each of a plurality of semiconductor wafers sequentially and conditioning the polishing pad prior to chemical-mechanical polishing the first semiconductor wafer.

9. The method according to claim 1, comprising planarizing a dielectric layer on a plurality of semiconductor wafers sequentially and conditioning the polishing pad prior to chemical-mechanical polishing each semiconductor wafer.

10. The method according to claim 9, comprising applying a downward force of about 6 to about 8 lbs. on the abrasive diamond grit wheel, rotating the polishing pad at about 15 to about 50 rpm, rotating the abrasive diamond grit wheel at about 20 to about 40 rpm, and sweeping the abrasive diamond grit wheel across the surface of the polishing pad about 3 to about 7 sweeps between wafers.

11. The method according to claim 10, wherein the residence time of the abrasive diamond grit wheel is greater at the center portion of the polishing pad than at the peripheral portion of the polishing pad.

12. The method according to claim 11, wherein the residence time is less at a portion of the polishing pad intermediate the center and the peripheral portions than at the center and peripheral portions.

13. The method according to claim 12, wherein the polishing pad is dome-shaped.

14. The method according to claim 9, comprising conditioning the polishing pad by moving the abrasive diamond grit wheel across the surface of the polishing pad under pressure for about 10 to about 30 sweeps for about 4 to about 10 minutes prior to initially using the polishing pad for chemical-mechanical polishing.

15. The method according to claim 14, wherein the number of sweeps is about 15 to about 25 for about 5 to about 9 minutes.

16. The method according to claim 15, wherein the number of sweeps is about 20 for about 7 to 8 minutes.

17. The method according to claim 9, further comprising conditioning the polishing pad prior to chemical-mechanical polishing each semiconductor wafer sequentially.

18. The method according to claim 1, wherein the polishing pad comprises a fibrous polymeric material.

19. The method according to claim 1, wherein the pressure is about 8 to about 12 psi.

20. The method according to claim 19, wherein the pressure is about 10 psi.

21. The method according to claim 1, wherein the polishing pad is rotated in excess of about 30 rpm.

22. The method according to claim 21, wherein the polishing pad is rotated at about 50 to about 80 rpm.

23. The method according to claim 22, wherein the polishing pad is rotated at about 65 rpm.

24. The method according to claim 21, wherein the dielectric material comprises an undoped oxide, the pressure is about 10 psi, the wafer carrier speed is about 10 rpm, the polishing pad is rotated about 65 rpm, the slurry is dispensed at a rate of about 100 to about 200 mil/min. at ambient temperature; and wherein the doped oxide is removed at a rate of about 4,000 Å/min. to about 5,000 Å/min.

25. The method according to claim 24, wherein the polishing pad is conditioned by sweeping an abrasive diamond grit wheel across the surface of the polishing pad 3 to 7 sweeps with a downward force of about 6 to about 8 lbs., while the polishing pad is rotated at about 15 to about 50 rpm, and the abrasive diamond grit wheel is rotated in the same direction as the polishing pad at about 20 to about 40 rpm.

26. The method according to claim 1, wherein the slurry is dispensed from a drip tube.

27. The method according to claim 26, wherein the slurry is dispensed at a rate of about 50 to about 500 ml/min.

28. The method according to claim 1, wherein the wafer is held in a carrier rotating in the same direction as the polishing pad.

29. The method according to claim 28, wherein the carrier is rotated in excess of 20 rpm.

30. The method according to claim 1, wherein the dielectric material comprises a doped oxide, the pressure is about 10 psi, the wafer carrier speed is about 15 rpm, the polishing pad is rotated about 20 to about 65 rpm, the slurry dispensed at about 100 to about 200 mil/min. at ambient temperature, whereby the doped oxide is removed at a rate of about 7,000 Å/min. to about 12,000 Å/min.

31. The method according to claim 30, wherein the polishing pad is conditioned by sweeping an abrasive diamond grit wheel across the surface of the polishing pad 3 to 7 sweeps with a downward force of about 6 to about 8 lbs. while the polishing pad is rotated at about 15 to about 50 rpm, and the abrasive diamond grit wheel is rotated in the same direction as the polishing pad at about 20 to about 40 rpm.

32. The method according to claim 1, wherein the dielectric layer comprises a conductive pattern.

33. The method according to claim 32, wherein the conductive pattern was formed by a damascene process.

* * * * *